United States Patent
Sagi et al.

(10) Patent No.: US 10,909,079 B1
(45) Date of Patent: Feb. 2, 2021

(54) DATA-DRIVEN REDUCTION OF LOG MESSAGE DATA

(71) Applicant: EMC IP Holding Company LLC, Hopkinton, MA (US)

(72) Inventors: Omer Sagi, Mazkeret Batya (IL); Maor Sade, Tel Aviv (IL); Avitan Gefen, Tel Aviv (IL); Alon Shitrit, Jerusalem (IL)

(73) Assignee: EMC IP Holding Company LLC, Hopkinton, MA (US)

( * ) Notice: Subject to any disclaimer, the term of this patent is extended or adjusted under 35 U.S.C. 154(b) by 197 days.

(21) Appl. No.: 15/940,240

(22) Filed: Mar. 29, 2018

(51) Int. Cl.
  *G06F 16/174* (2019.01)
  *G06F 9/54* (2006.01)
  *G06F 16/11* (2019.01)

(52) U.S. Cl.
  CPC .......... *G06F 16/1748* (2019.01); *G06F 9/546* (2013.01); *G06F 16/116* (2019.01)

(58) Field of Classification Search
  None
  See application file for complete search history.

(56) References Cited

U.S. PATENT DOCUMENTS

| | | | |
|---|---|---|---|
| 2002/0091715 A1* | 7/2002 | Coady | G06F 16/3344 |
| 2008/0172409 A1* | 7/2008 | Botros | G06F 16/9038 |
| 2015/0019512 A1* | 1/2015 | Basak | G06F 16/335 |
| | | | 707/692 |
| 2017/0323114 A1* | 11/2017 | Egorov | G06F 21/602 |
| 2018/0060448 A1* | 3/2018 | Miyamoto | G06F 16/00 |
| 2018/0165173 A1* | 6/2018 | Lin | G06F 11/3476 |
| 2019/0182382 A1* | 6/2019 | Mazza | H04M 3/527 |

OTHER PUBLICATIONS

Savir et al., "Real-Time Compression of Log Data" U.S. Appl. No. 15/940,247, filed Mar. 29, 2018.

* cited by examiner

*Primary Examiner* — Mark D Featherstone
*Assistant Examiner* — Samuel C Sharpless, III
(74) *Attorney, Agent, or Firm* — Ryan, Mason & Lewis, LLP

(57) ABSTRACT

Techniques are provided for data-driven reduction of log message data. An exemplary method comprises: obtaining log files and user-specified configuration parameters, wherein the log files each comprise one or more log messages; generating an event count matrix indicating a number of times each of a plurality of unique messages appeared in a given log file of the log files; generating a correlation graph by inserting similar messages with a mutual undirected edge, wherein similar messages are identified based on a predefined similarity measure; extracting redundant messages from the correlation graph by selecting log messages for inclusion in an uninformative log message filter from sub-graphs of the correlation graph in which any two nodes are connected together, except those log messages satisfying a predefined message frequency criteria; and identifying one or more redundant messages using the uninformative log message filter. The uninformative log message filter is optionally applied to real-time log messages and/or existing file systems.

20 Claims, 8 Drawing Sheets

1. logger.write('Starting function_x')

function_x()

2. Logger.write('returned from function_x')

200 function_x():
3. logger.write('initialize parameters in function_x')
SOME CODE#
4. logger.write('finished function_x')

| LOG FILES | MESSAGE 1 | MESSAGE 2 | ... | MESSAGE N |
|---|---|---|---|---|
| | | | | |
| | | | | |
| | | | | |

EVENT COUNT MATRIX 500

FIG. 5

DATA-DRIVEN REDUCTION OF LOG MESSAGE DATA

FIELD

The field relates generally to the processing of log messages.

BACKGROUND

Traditional log file systems typically store all of the log data generated by a monitored system, such as software and/or hardware applications, regardless of the relevancy of a given log message, for example, to log data analysis tasks. Log files often contain many uninformative log messages, or portions thereof, due to the writing of redundant log messages. Those uninformative messages are stored in the log file system, consuming storage resources and causing challenges for data analysis tasks. In addition, redundant log messages impair the concept of representing a system event with a single log message, as multiple log messages can be associated with a single event. This issue becomes particularly critical when using such log messages as inputs to machine learning models.

A need therefore exists for techniques for reducing log file system size and easing log data analysis tasks. A further need exists for techniques for identifying redundant log messages.

SUMMARY

Illustrative embodiments of the present disclosure provide techniques for data-driven reduction of log message data. In one embodiment, an exemplary method comprises: obtaining a plurality of log files and one or more user-specified configuration parameters, wherein the plurality of log files each comprise one or more log messages; generating an event count matrix indicating a number of times each of a plurality of unique messages appeared in a given log file of the plurality of log files; generating a correlation graph by inserting similar messages with a mutual undirected edge, wherein the similar messages are identified based on a predefined similarity measure; extracting redundant messages from the correlation graph by selecting log messages for inclusion in an uninformative log message filter from sub-graphs of the correlation graph in which any two nodes are connected together, except those log messages satisfying a predefined message frequency criteria; and identifying one or more redundant messages using the uninformative log message filter.

In some embodiments, the uninformative log message filter comprises (i) a list of unique log messages to be discarded, and/or (ii) a plurality of sub-filters distributed over one or more computing nodes, wherein an output of each of the plurality of sub-filters is aggregated. The uninformative log message filter can optionally be applied to real-time log messages and/or existing file systems comprised of a plurality of log files.

Other illustrative embodiments include, without limitation, apparatus, systems, methods and computer program products comprising processor-readable storage media.

BRIEF DESCRIPTION OF THE DRAWINGS

FIG. 2 provides an example of log data redundancy, according to some embodiments;

FIG. 5 is a table illustrating an exemplary event count matrix that may be generated by the exemplary filter generator module process of FIG. 4, according to one embodiment;

DETAILED DESCRIPTION

Illustrative embodiments of the present disclosure will be described herein with reference to exemplary communication, storage and processing devices. It is to be appreciated, however, that the disclosure is not restricted to use with the particular illustrative configurations shown. One or more embodiments of the disclosure provide log message reduction techniques.

In one or more embodiments, a data driven tool is provided that automatically identifies redundant messages, significantly reduces storage requirements and/or improves data quality of log file systems. The disclosed log message reduction techniques leverage machine learning approaches and graph theory methods to identify formats of redundant log messages and to define an uninformative log message filter that separates informative log messages from uninformative ones. The generated filter can then be applied as a module in real-time message logging and/or as an ad hoc tool for removing uninformative log messages from log file systems.

Figure 1:
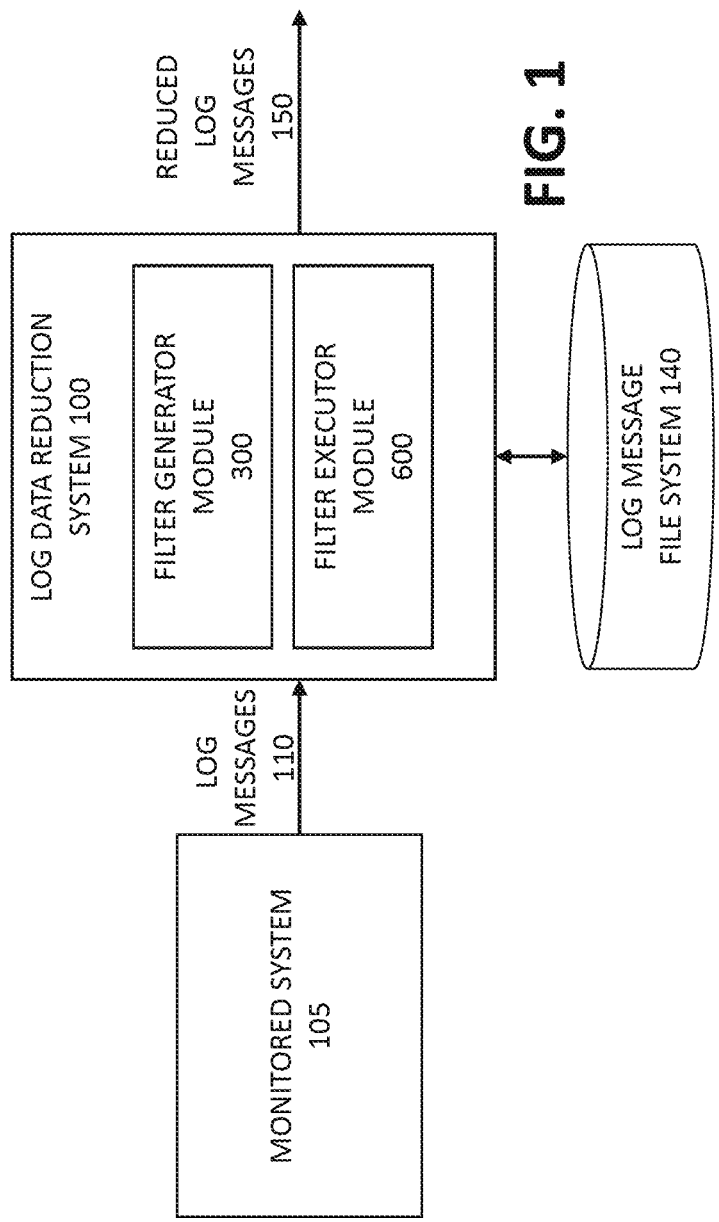
FIG. 1 illustrates an exemplary log data reduction system, according to an embodiment of the disclosure.

FIG. 1 illustrates an exemplary log data reduction system 100, according to an embodiment of the disclosure. As shown in FIG. 1, the exemplary log data reduction system 100 processes log messages 110 from a monitored system 105, such as a software and/or hardware application, and generates a set of reduced log messages 150.

The exemplary log data reduction system 100 comprises a filter generator module 300, as discussed further below in conjunction with FIG. 3, and a filter executor module 600, as discussed further below in conjunction with FIG. 6. Generally, the filter generator module 300 leverages similarity measures and graph theory methods to create a filter of uninformative log messages. In some embodiments, discussed further below, the filter generator module 300 processes a set of existing log files, such as those stored in an existing log message file system 140, and several user-specified configuration parameters as inputs, and generates a log message filter that identifies redundant messages. Generally, as discussed further below, the filter executor module 600 uses the generated filter to reduce the size of an existing log message file system 140 or to filter new logs in real-time, for example, as they are stored in a log message file system 140. The following section provides detailed description of each of these components.

FIG. 2 provides an example of code 200, 250 that will result in redundant log messages, according to some embodiments. A first set of code 200 performs two log write operations and calls a function defined by a second set of code 250 that also performs two log write operations, in addition to executing additional code. In the example of FIG. 2, the code 200 and 250 will result in redundant log messages as the write operations performed in line 3 and line 2 can be pre-determined by the writes made in line 1 and line 4, respectively. There are many cases in which this kind of redundancy cannot be prevented in advance as the person who writes a function 'func1' is not necessarily familiar with the content of function 'func2' that is called from function 'func1'. The reoccurrence of such cases in complex systems may increase the required log investigation time and entangle the log file analysis, in general.

Event log messages are typically stored by default as plain text on some local and/or remote servers. Having a substantial amount of redundant or otherwise uninformative log messages unnecessarily increases the consumption of storage resources and therefore, increases costs for log data owners.

The typical purpose of a log message is to represent a single event that occurred in a monitored system. Deriving several log messages from the same single event (as in the example of FIG. 2) may result in a log file that does not reflect the reality, confusing a single event with multiple events due to unnecessary log writes. This conceptual issue often becomes concrete when log files are served as inputs for machine learning models. Machine learning models typically expect the log file to provide log information about a certain incident; hence, redundant log messages may serve as redundant pieces of log information that tell a biased story about the analyzed incident.

Figure 3:
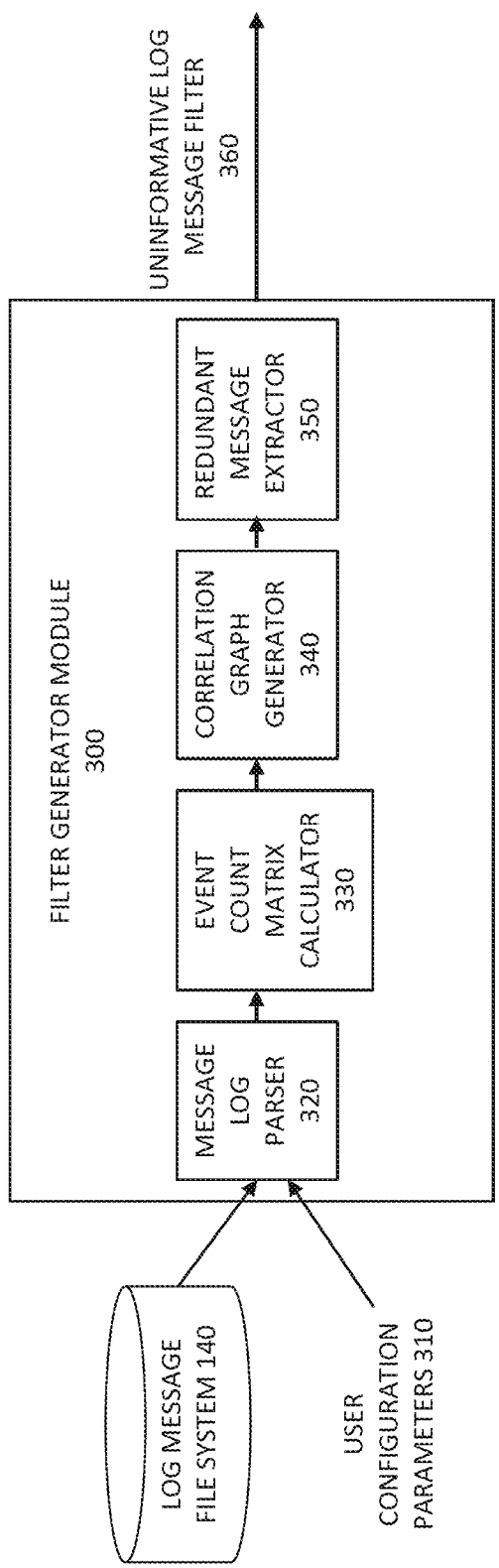
FIG. 3 illustrates the filter generator module of FIG. 1 in further detail, according to some embodiments of the disclosure.

FIG. 3 illustrates the filter generator module 300 of FIG. 1 in further detail, according to some embodiments of the disclosure. As shown in FIG. 3, the exemplary filter generator module 300 processes log files from the log message file system 140, as well as user configuration parameters 310, and generates an uninformative log message filter 360. The log files from the log message file system 140 (or a sufficiently large sample thereof) are used as an input for the filter generation.

In some embodiments, the user configuration parameters 310 are specified by a user and comprise, for example, a number of log files to be sampled, a lower bound of correlation between messages when deciding whether to include them in the graph, and one or more specific formats that should not be excluded (even if they seem redundant based on the generated model). The user configuration parameters 310 also specify the format of a unique message, given as a regular expression. For example, the regular expression can specify the use of a concatenation of [event id] and [function name] as the unique identifier of a log message.

As shown in FIG. 3, the exemplary filter generator module 300 comprises a message log parser 320, an event count matrix calculator 330, a correlation graph generator 340, and a redundant message extractor 350. Generally, the message log parser 320 converts each log file from the log message file system 140 into a set of dictionaries (e.g., key-value pairs), in which keys identify unique messages and values represent the number of times each key has appeared in the log file. The message log parser 320 uses the regular expression that was given in the user configuration parameters 310 to convert each log file into a key-value dictionary representation.

In some embodiments, the exemplary event count matrix calculator 330 converts the set of key-value dictionaries into an event count matrix, as discussed further below in conjunction with FIG. 5, in which columns represent unique messages and rows represent log files. Individual cell values indicate the number of times a unique message appeared in a given log file. The event count matrix can optionally be stored as a sparse matrix, depending on available computing resources. The event count matrix provides a preliminary step for calculating the correlation among different log messages.

In one or more embodiments, the exemplary correlation graph generator 340 initializes an empty graph, and the nodes in the graph are unique messages that have at least one other correlated message (based on the threshold given by the user in the user configuration parameters 310). Two messages that are connected with an undirected edge are considered to be correlated. For each pair of columns/messages from the event count matrix, the correlation is calculated and the two messages are added to the graph (if they are not already in the graph) with an undirected edge between them. Moreover, other similarity measurements can be used as well, based on a predefined similarity measure, such as a Cosine similarity, a Pearson correlation, a Jaccard distance or a Hamming distance.

In at least one embodiment, the exemplary redundant message extractor 350 extracts cliques (e.g., sub-graphs) from the correlation graph, where the extracted sub-graphs are those sub-graphs in which any two nodes are connected to each other. The extraction of redundant messages is done in the following manner: from each clique, all the messages to be included in the filter are selected except for the most frequent message (in terms of the number of log files that include this message).

In one or more embodiments, the generated uninformative log message filter 360 comprises a list of unique messages, for example, given in their parsed form, that are to be excluded from the log message file system 140 if the uninformative log message filter 360 is executed.

Figure 4:
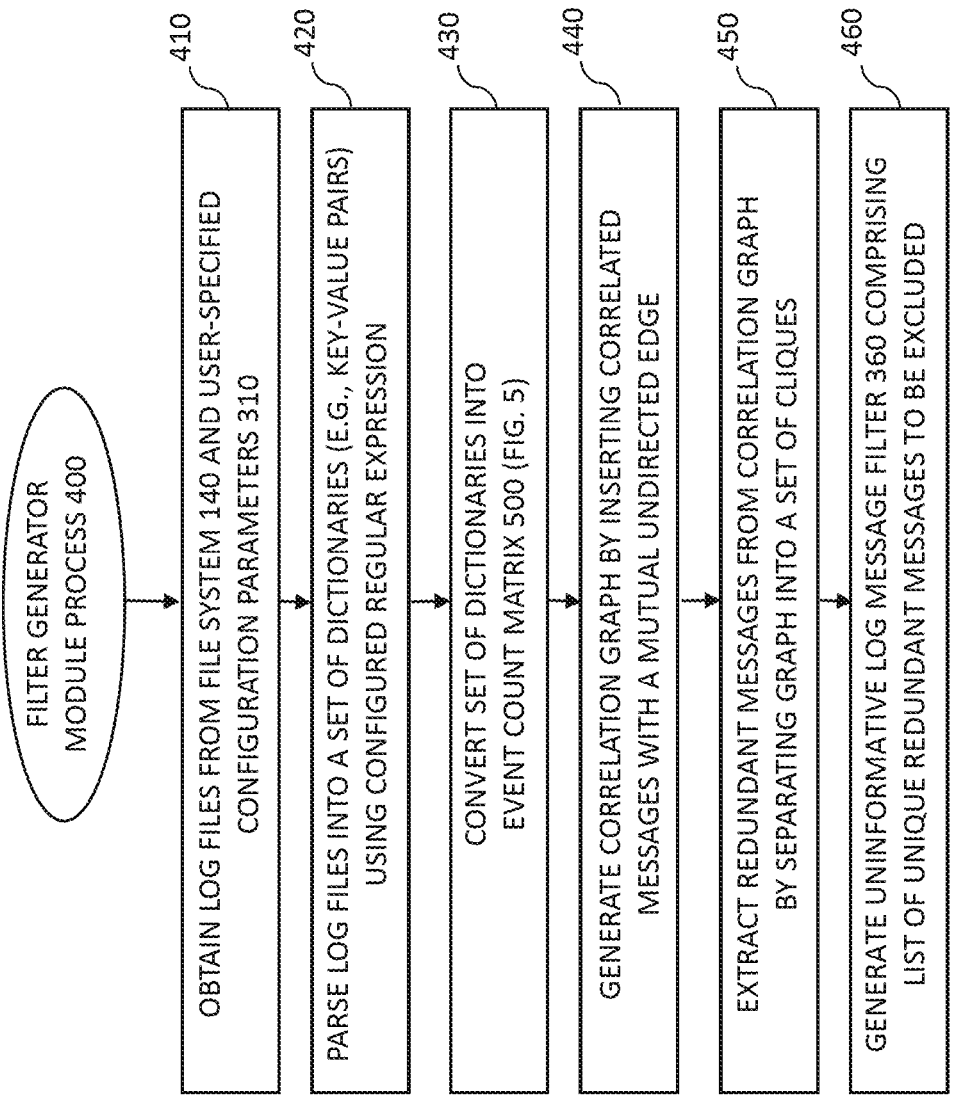
FIG. 4 is a flow chart illustrating a filter generator module process that may be performed by the exemplary filter generator module of FIG. 3, according to some embodiments.

FIG. 4 is a flow chart illustrating a filter generator module process 400 that may be performed by the exemplary filter generator module 300 of FIG. 3, according to some embodiments. As shown in FIG. 4, the exemplary filter generator module process 400 initially obtains the log files from the log message file system 140 and the user-specified configuration parameters 310 during step 410.

Thereafter, the filter generator module process 400 parses the obtained log files during step 420 into a set of dictionaries (e.g., key-value pairs) using the configured regular expression, as discussed above in conjunction with FIG. 3. The set of dictionaries are then converted during step 430 into the event count matrix 500, as discussed further below in conjunction with FIG. 5.

The correlation graph is generated during step 440 by inserting correlated messages with a mutual undirected edge into the graph. In some embodiments, an empty graph is initialized, and the nodes in the graph comprise unique messages that have at least one other correlated message (based on the threshold given by the user in the user configuration parameters 310). Two messages that are connected with an undirected edge are considered to be correlated.

During step 450, the exemplary filter generator module process 400 extracts redundant messages from the generated correlation graph by separating the graph into a set of cliques (sub-graphs). The extracted sub-graphs are those sub-graphs in which any two nodes are connected to each other. The extraction of redundant messages is done in the following manner: from each clique, all the messages to be included in the uninformative log message filter 360 are selected except for the most frequent message (in terms of the number of log files that include this message), or based on another predefined frequency metric.

Finally, during step 460, the filter generator module process 400 generates the uninformative log message filter 360, for example, comprising a list of unique redundant messages to be excluded.

FIG. 5 is a table illustrating an exemplary event count matrix 500 that may be generated by the exemplary filter generator module process 400 of FIG. 4, according to one embodiment. As noted above, the exemplary event count matrix calculator 330 converts the set of key-value dictionaries into the event count matrix 500, in which columns represent unique messages and rows represent log files. Individual cell values indicate the number of times a unique message appeared in a given log file.

Figure 6:
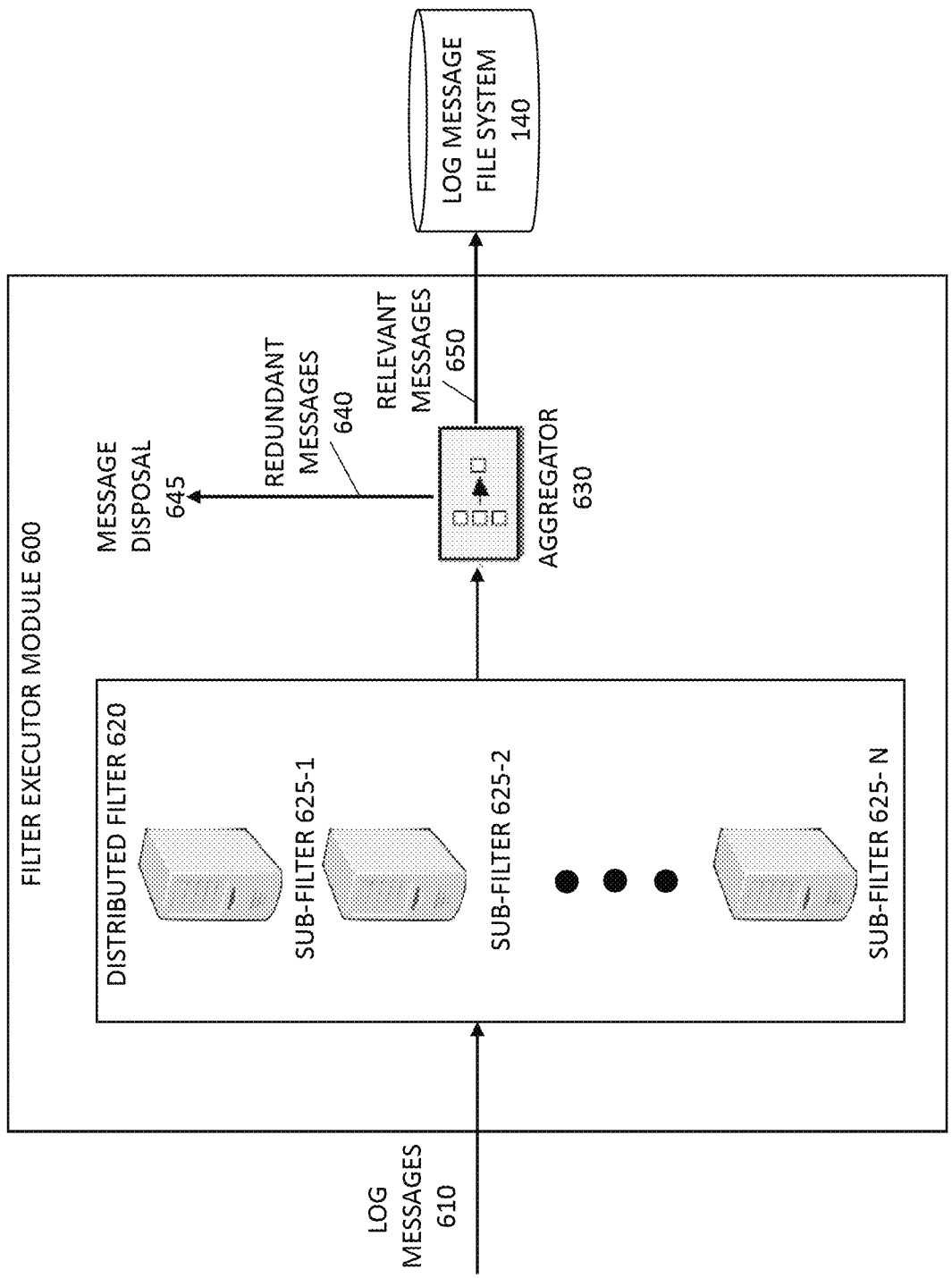
FIG. 6 illustrates the filter executor module of FIG. 1 in further detail, according to some embodiments of the disclosure.

FIG. 6 illustrates the filter executor module 600 of FIG. 1 in further detail, according to some embodiments of the disclosure. As shown in FIG. 6, the exemplary filter executor module 600 applies one or more log messages 610 to a distributed filter 620 implementation of the uninformative log message filter 360. The exemplary distributed filter 620 comprises a plurality of sub-filters 625-1 through 625-N. When executing the uninformative log message filter 360 in a distributed manner, each log message 610 is distributed across the different sub-filters 625, where each sub-filter 625 contains a subset of the messages that are to be filtered. Each sub-filter 625 returns a value of True, if the message does not fail at any of the contained formats and a value of False otherwise. All of the outputs of the sub-filters 625 are then digested into an aggregator 630 that decides whether to store the log message 610 in the log message file system 140 for relevant messages 650 (e.g., if all sub-filters returned a value of True) or to delete redundant messages 640 in a message disposal 645 (e.g., if at least one sub-filter 625 returned a value of False).

As noted above, the exemplary filter executor module 600 can be used in two different settings. First, the filter executor module 600 can serve as a supplementary component of a real-time log collection system, filtering uninformative messages and preventing their storage in the log message file system 140. Second, the filter executor module 600 can be executed in an ad hoc manner for cleaning the existing log message file system 140 of redundant log messages. In one or more embodiments, the filter execution is a highly parallelized process and can be distributed across multiple computing units since the only purpose of the uninformative log message filter 360 is to check whether a specific log message should be excluded. For example, if the filter requires the exclusion of a log message 610 in which [function=func_a] and [operation=start] and [type=critical], then the uninformative log message filter 360 will exclude the following log message:

20-07-2017 08:14:54<critical> start func_a component a position a9hjnds89.

In some embodiments, the disclosed log message reduction techniques identify redundant messages, significantly reduce storage requirements and improve data quality of log file systems.

Among other benefits, the disclosed log message reduction techniques leverage machine learning approaches and graph theory methods to identify formats of redundant log messages and to define an uninformative log message filter that separates informative log messages from uninformative ones.

Machine learning models that characterize log files typically treat log messages as indicators for single events. The disclosed log message reduction techniques improve the quality of the data digested into such models by considering a single log message for each event, preventing an erroneous representation of a single event by multiple log messages and therefore, preventing a model bias towards events that generate a relative large amount of log messages.

One or more embodiments of the disclosure provide improved methods, apparatus and computer program product for log message reduction. The foregoing applications and associated embodiments should be considered as illustrative only, and numerous other embodiments can be configured using the techniques disclosed herein, in a wide variety of different applications.

It should also be understood that the disclosed log message reduction techniques, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The disclosed log message reduction techniques may be implemented using one or more processing platforms. One or more of the processing modules or other components may therefore each run on a computer, storage device or other processing platform element. A given such element may be viewed as an example of what is more generally referred to herein as a "processing device."

As noted above, illustrative embodiments disclosed herein can provide a number of significant advantages relative to conventional arrangements. It is to be appreciated that the particular advantages described above and elsewhere herein are associated with particular illustrative embodiments and need not be present in other embodiments. Also, the particular types of information processing system features and functionality as illustrated and described herein are exemplary only, and numerous other arrangements may be used in other embodiments.

In these and other embodiments, compute services can be offered to cloud infrastructure tenants or other system users as a Platform as a Service (PaaS) offering, although numerous alternative arrangements are possible.

Some illustrative embodiments of a processing platform that may be used to implement at least a portion of an information processing system comprise cloud infrastructure including virtual machines implemented using a hypervisor that runs on physical infrastructure. The cloud infrastructure further comprises sets of applications running on respective ones of the virtual machines under the control of the hypervisor. It is also possible to use multiple hypervisors each providing a set of virtual machines using at least one underlying physical machine. Different sets of virtual machines provided by one or more hypervisors may be utilized in configuring multiple instances of various components of the system.

These and other types of cloud infrastructure can be used to provide what is also referred to herein as a multi-tenant environment. One or more system components such as a log message reduction system 100, or portions thereof, are illustratively implemented for use by tenants of such a multi-tenant environment.

Cloud infrastructure as disclosed herein can include cloud-based systems such as Amazon Web Services (AWS), Google Cloud Platform (GCP) and Microsoft Azure. Virtual machines provided in such systems can be used to implement at least portions of a log message reduction platform in illustrative embodiments. The cloud-based systems can include object stores such as Amazon S3, GCP Cloud Storage, and Microsoft Azure Blob Storage.

In some embodiments, the cloud infrastructure additionally or alternatively comprises a plurality of containers implemented using container host devices. For example, a given container of cloud infrastructure illustratively comprises a Docker container or other type of Linux Container (LXC). The containers may run on virtual machines in a multi-tenant environment, although other arrangements are possible. The containers may be utilized to implement a variety of different types of functionality within the storage devices. For example, containers can be used to implement respective processing devices providing compute services of a cloud-based system. Again, containers may be used in combination with other virtualization infrastructure such as virtual machines implemented using a hypervisor.

Illustrative embodiments of processing platforms will now be described in greater detail with reference to FIGS. 7 and 8. These platforms may also be used to implement at least portions of other information processing systems in other embodiments.

Figure 7:
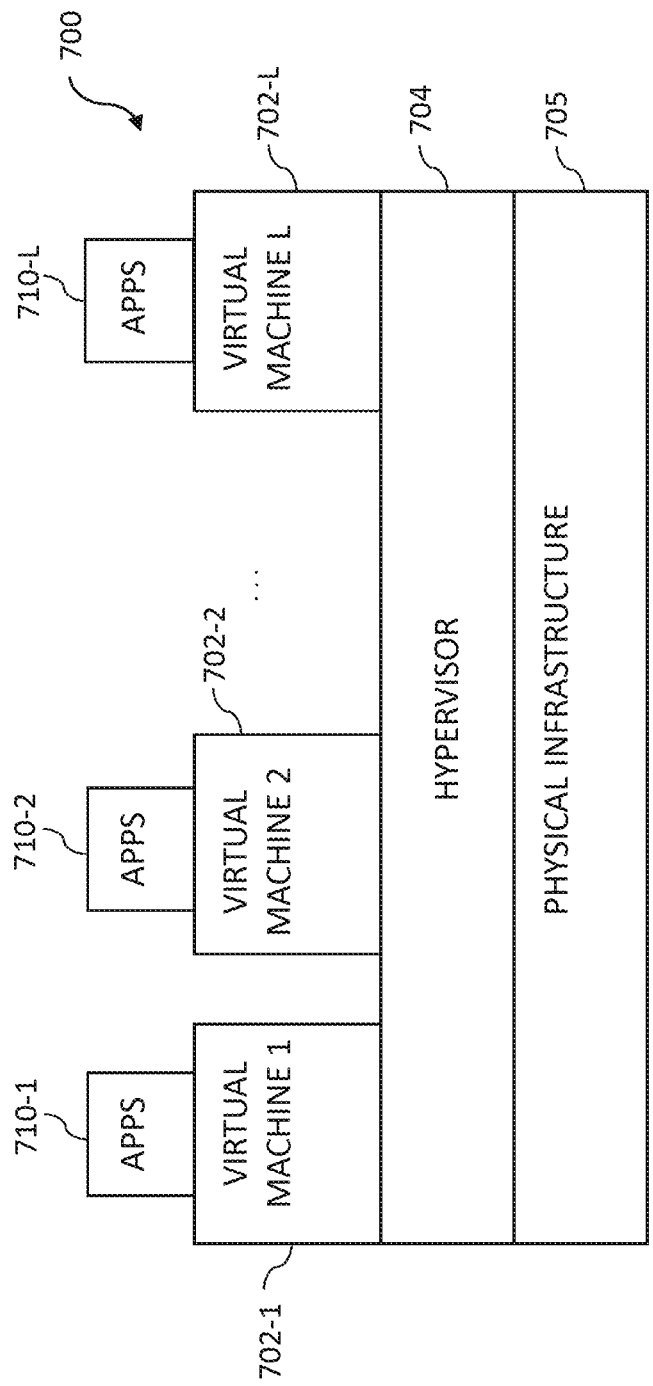
FIG. 7 illustrates an exemplary processing platform that may be used to implement at least a portion of one or more embodiments of the disclosure comprising a cloud infrastructure.

Referring now to FIG. 7, one possible processing platform that may be used to implement at least a portion of one or more embodiments of the disclosure comprises cloud infrastructure 700. The cloud infrastructure 700 in this exemplary processing platform comprises virtual machines (VMs) 702-1, 702-2, . . . 702-L implemented using a hypervisor 704. The hypervisor 704 runs on physical infrastructure 705. The cloud infrastructure 700 further comprises sets of applications 710-1, 710-2, . . . 710-L running on respective ones of the virtual machines 702-1, 702-2, . . . 702-L under the control of the hypervisor 704.

The cloud infrastructure 700 may encompass the entire given system or only portions of that given system, such as one or more of client, servers, controllers, or computing devices in the system.

Although only a single hypervisor 704 is shown in the embodiment of FIG. 7, the system may of course include multiple hypervisors each providing a set of virtual machines using at least one underlying physical machine. Different sets of virtual machines provided by one or more hypervisors may be utilized in configuring multiple instances of various components of the system.

An example of a commercially available hypervisor platform that may be used to implement hypervisor 704 and possibly other portions of the system in one or more embodiments of the disclosure is the VMware® vSphere™ which may have an associated virtual infrastructure management system, such as the VMware® vCenter™. As another example, portions of a given processing platform in some embodiments can comprise converged infrastructure such as VxRail™, VxRack™, VxBlock™, or Vblock® converged infrastructure commercially available from VCE, the Virtual Computing Environment Company, now the Converged Platform and Solutions Division of Dell EMC of Hopkinton, Mass. The underlying physical machines may comprise one or more distributed processing platforms that include storage products.

Particular types of storage products that can be used in implementing a given storage system of the log message reduction system 100 in an illustrative embodiment include VNX® and Symmetrix VMAX® storage arrays, software-defined storage products such as ScaleIO™ and ViPR®, all-flash and hybrid flash storage arrays such as Unity™, cloud storage products such as Elastic Cloud Storage (ECS), object-based storage products such as Atmos®, scale-out all-flash storage arrays such as XtremIO™, and scale-out NAS clusters comprising Isilon® platform nodes and associated accelerators, all from Dell EMC. Combinations of multiple ones of these and other storage products can also be used in implementing a given storage system in an illustrative embodiment.

In some embodiments, the cloud infrastructure additionally or alternatively comprises a plurality of containers implemented using container host devices. For example, a given container of cloud infrastructure illustratively comprises a Docker container or other type of LXC. The containers may be associated with respective tenants of a multi-tenant environment of the system, although in other embodiments a given tenant can have multiple containers. The containers may be utilized to implement a variety of different types of functionality within the system. For example, containers can be used to implement respective compute nodes or cloud storage nodes of a cloud computing and storage system. The compute nodes or storage nodes may be associated with respective cloud tenants of a multi-tenant environment of system. Containers may be used in combination with other virtualization infrastructure such as virtual machines implemented using a hypervisor.

As is apparent from the above, one or more of the processing modules or other components of the disclosed log message reduction system 100 may each run on a computer, server, storage device or other processing platform element. A given such element may be viewed as an example of what is more generally referred to herein as a "processing device." The cloud infrastructure 700 shown in FIG. 7 may represent at least a portion of one processing platform.

Figure 8:
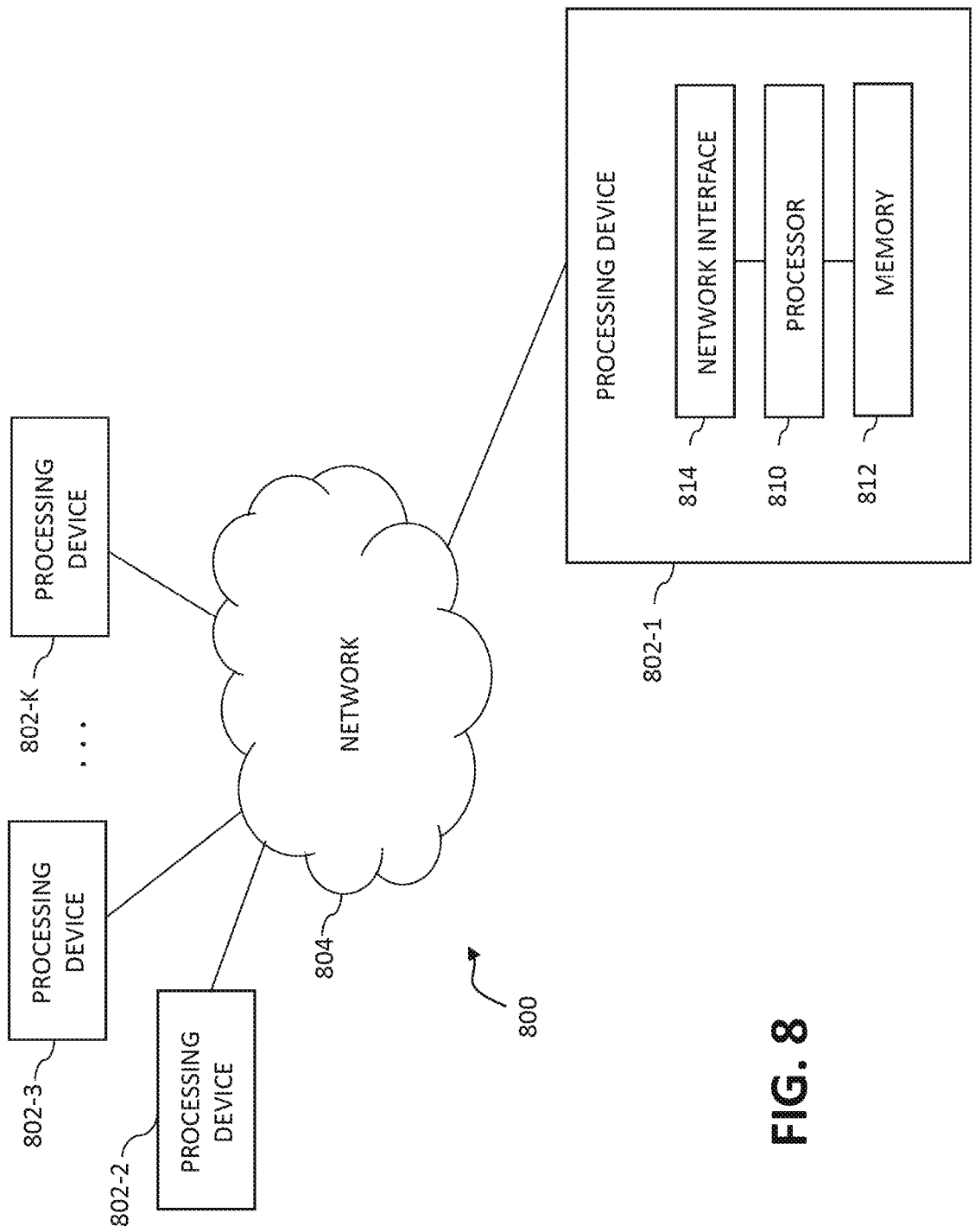
FIG. 8 illustrates another exemplary processing platform that may be used to implement at least a portion of one or more embodiments of the disclosure.

Another example of a processing platform is processing platform 800 shown in FIG. 8. The processing platform 800 in this embodiment comprises at least a portion of the given system and includes a plurality of processing devices, denoted 802-1, 802-2, 802-3, . . . 802-K, which communicate with one another over a network 804. The network 804 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 802-1 in the processing platform 800 comprises a processor 810 coupled to a memory 812. The processor 810 may comprise a microprocessor, a microcontroller, an application specific integrated circuit (ASIC), a field programmable gate array (FPGA) or other type of processing circuitry, as well as portions or combinations of such circuitry elements, and the memory 812, which may be viewed as an example of a "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 802-1 is network interface circuitry 814, which is used to interface the processing device with the network 804 and other system components, and may comprise conventional transceivers.

The other processing devices 802 of the processing platform 800 are assumed to be configured in a manner similar to that shown for processing device 802-1 in the figure.

Again, the particular processing platform 800 shown in the figure is presented by way of example only, and the given system may include additional or alternative processing platforms, as well as numerous distinct processing platforms in any combination, with each such platform comprising one or more computers, storage devices or other processing devices.

Multiple elements of system may be collectively implemented on a common processing platform of the type shown in FIG. 7 or 8, or each such element may be implemented on a separate processing platform.

For example, other processing platforms used to implement illustrative embodiments can comprise different types of virtualization infrastructure, in place of or in addition to virtualization infrastructure comprising virtual machines. Such virtualization infrastructure illustratively includes container-based virtualization infrastructure configured to provide Docker containers or other types of LXCs.

As another example, portions of a given processing platform in some embodiments can comprise converged infrastructure such as VxRail™, VxRack™, VxBlock™, or Vblock® converged infrastructure commercially available from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the information processing system. Such components can communicate with other elements of the information processing system over any type of network or other communication media.

As indicated previously, components of an information processing system as disclosed herein can be implemented at least in part in the form of one or more software programs stored in memory and executed by a processor of a processing device. For example, at least portions of the functionality shown in one or more of the figures are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A method, comprising:
   obtaining a plurality of log files and one or more user-specified configuration parameters, wherein said plurality of log files each comprise one or more log messages;
   generating, using at least one processing device, an event count matrix indicating a number of times each of a plurality of unique messages appeared in a given log file of the plurality of log files, wherein the step of generating the event count matrix further comprises the steps of parsing the plurality of log files, using one or more regular expressions from the one or more user-specified configuration parameters to generate an identifier for each of the plurality of log messages, into a set of dictionaries indicating a number of times each unique message has appeared in each log file; and converting the set of dictionaries into the event count matrix indicating the number of times each unique message appeared in the given log file of the plurality of log files;
   generating, using the at least one processing device, a correlation graph by inserting similar messages with a mutual undirected edge using the event count matrix, wherein said similar messages are identified based on a predefined similarity measure;
   extracting, using said at least one processing device, redundant messages from the correlation graph by selecting log messages for inclusion in an uninformative log message filter from sub-graphs of the correlation graph in which any two nodes are connected together, except those log messages satisfying one or more predefined message frequency criteria; and
   identifying, using said at least one processing device, one or more redundant messages using said uninformative log message filter.

2. The method of claim 1, wherein the uninformative log message filter comprises a plurality of sub-filters distributed over one or more computing nodes.

3. The method of claim 2, further comprising the step of aggregating an output of each of said plurality of sub-filters.

4. The method of claim 1, wherein the uninformative log message filter comprises a list of unique log messages to be discarded.

5. The method of claim 1, wherein said one or more user-specified configuration parameters comprise one or more of a number of log files to be sampled, a lower bound of correlation between log messages when deciding whether to include the log messages in the correlation graph, and specific formats that should not be disposed even when the specific formats are redundant.

6. The method of claim 1, wherein the uninformative log message filter is applied to one or more of real-time log messages and one or more existing file systems comprising a plurality of log files.

7. The method of claim 1, wherein the one or more predefined message frequency criteria comprises one or more message frequency criteria based on a number of log files that include a given message.

8. A system, comprising:
   a memory; and
   at least one processing device, coupled to the memory, operative to implement the following steps:

obtaining a plurality of log files and one or more user-specified configuration parameters, wherein said plurality of log files each comprise one or more log messages;

generating, using at least one processing device, an event count matrix indicating a number of times each of a plurality of unique messages appeared in a given log file of the plurality of log files, wherein the step of generating the event count matrix further comprises the steps of parsing the plurality of log files, using one or more regular expressions from the one or more user-specified configuration parameters to generate an identifier for each of the plurality of log messages, into a set of dictionaries indicating a number of times each unique message has appeared in each log file; and converting the set of dictionaries into the event count matrix indicating the number of times each unique message appeared in the given log file of the plurality of log files;

generating, using the at least one processing device, a correlation graph by inserting similar messages with a mutual undirected edge using the event count matrix, wherein said similar messages are identified based on a predefined similarity measure;

extracting, using said at least one processing device, redundant messages from the correlation graph by selecting log messages for inclusion in an uninformative log message filter from sub-graphs of the correlation graph in which any two nodes are connected together, except those log messages satisfying one or more predefined message frequency criteria; and identifying, using said at least one processing device, one or more redundant messages using said uninformative log message filter.

9. The system of claim 8, wherein the uninformative log message filter comprises a plurality of sub-filters distributed over one or more computing nodes.

10. The system of claim 8, wherein said one or more user-specified configuration parameters comprise one or more of a number of log files to be sampled, a lower bound of correlation between log messages when deciding whether to include the log messages in the correlation graph, and specific formats that should not be disposed even when the specific formats are redundant.

11. The system of claim 8, wherein the uninformative log message filter is applied to one or more of real-time log messages and one or more existing file systems comprising a plurality of log files.

12. The system of claim 8, wherein the one or more predefined message frequency criteria comprises one or more message frequency criteria based on a number of log files that include a given message.

13. A computer program product, comprising a non-transitory machine-readable storage medium having encoded therein executable code of one or more software programs, wherein the one or more software programs when executed by at least one processing device perform the following steps:

obtaining a plurality of log files and one or more user-specified configuration parameters, wherein said plurality of log files each comprise one or more log messages;

generating, using at least one processing device, an event count matrix indicating a number of times each of a plurality of unique messages appeared in a given log file of the plurality of log files, wherein the step of generating the event count matrix further comprises the steps of parsing the plurality of log files, using one or more regular expressions from the one or more user-specified configuration parameters to generate an identifier for each of the plurality of log messages, into a set of dictionaries indicating a number of times each unique message has appeared in each log file; and converting the set of dictionaries into the event count matrix indicating the number of times each unique message appeared in the given log file of the plurality of log files;

generating, using the at least one processing device, a correlation graph by inserting similar messages with a mutual undirected edge using the event count matrix, wherein said similar messages are identified based on a predefined similarity measure;

extracting, using said at least one processing device, redundant messages from the correlation graph by selecting log messages for inclusion in an uninformative log message filter from sub-graphs of the correlation graph in which any two nodes are connected together, except those log messages satisfying one or more predefined message frequency criteria; and identifying, using said at least one processing device, one or more redundant messages using said uninformative log message filter.

14. The computer program product of claim 13, wherein the uninformative log message filter comprises a plurality of sub-filters distributed over one or more computing nodes, wherein an output of each of said plurality of sub-filters is aggregated.

15. The computer program product of claim 13, wherein said one or more user-specified configuration parameters comprise one or more of a number of log files to be sampled, a lower bound of correlation between log messages when deciding whether to include the log messages in the correlation graph, and specific formats that should not be disposed even when the specific formats are redundant.

16. The computer program product of claim 13, wherein the uninformative log message filter is applied to one or more of real-time log messages and one or more existing file systems comprising a plurality of log files.

17. The computer program product of claim 13, wherein the one or more predefined message frequency criteria comprises one or more message frequency criteria based on a number of log files that include a given message.

18. The system of claim 9, further comprising the step of aggregating an output of each of said plurality of sub-filters.

19. The system of claim 8, wherein the uninformative log message filter comprises a list of unique log messages to be discarded.

20. The computer program product of claim 13, wherein the uninformative log message filter comprises a list of unique log messages to be discarded.

* * * * *